(12) United States Patent
Galvano et al.

(10) Patent No.: US 11,316,322 B2
(45) Date of Patent: Apr. 26, 2022

(54) LASER DIODE MODULE

(71) Applicant: Infineon Technologies AG, Neubiberg (DE)

(72) Inventors: Maurizio Galvano, Padua (IT); Gianmaria Furlan, Padua (IT); Andrea Logiudice, Montegrotto Terme (IT); Franco Mignoli, Verona (IT)

(73) Assignee: Infineon Technologies AG, Neubiberg (DE)

( * ) Notice: Subject to any disclaimer, the term of this patent is extended or adjusted under 35 U.S.C. 154(b) by 4 days.

(21) Appl. No.: 16/802,294

(22) Filed: Feb. 26, 2020

(65) Prior Publication Data

US 2020/0194963 A1 Jun. 18, 2020

Related U.S. Application Data

(62) Division of application No. 15/926,499, filed on Mar. 20, 2018, now abandoned.
(Continued)

(51) Int. Cl.
*H01S 5/0239* (2021.01)
*H01S 5/02* (2006.01)
*H01S 5/026* (2006.01)
*G01S 7/481* (2006.01)
*H01S 5/042* (2006.01)
*H01S 5/0231* (2021.01)
(Continued)

(52) U.S. Cl.
CPC .......... *H01S 5/0215* (2013.01); *G01S 7/4813* (2013.01); *G01S 7/4814* (2013.01); *H01S 5/0231* (2021.01); *H01S 5/0239* (2021.01); *H01S 5/0261* (2013.01); *H01S 5/0428* (2013.01); *G01S 7/484* (2013.01); *H01S 5/0234* (2021.01); *H01S 5/02345* (2021.01); *H01S 5/04257* (2019.08); *H01S 5/32341* (2013.01)

(58) Field of Classification Search
CPC ...................................................... H01S 5/0239
See application file for complete search history.

(56) References Cited

U.S. PATENT DOCUMENTS 5,977,565 A 11/1999 Ishikawa et al.
6,005,262 A 12/1999 Cunningham et al.
(Continued)

FOREIGN PATENT DOCUMENTS

CN 101127384 A 2/2008
CN 102810624 A 12/2012
(Continued)

OTHER PUBLICATIONS

Office Action, in the Chinese language, from counterpart Chinese Application No. 201810244946.0, dated Apr. 21, 2020, 7 pp.
(Continued)

*Primary Examiner* — Tod T Van Roy
(74) *Attorney, Agent, or Firm* — Shumaker & Sieffert, P.A.

(57) ABSTRACT

A laser diode module is described herein. In accordance with a first exemplary embodiment, the laser diode module includes a first semiconductor die including at least one electronic switch, and a second semiconductor die including at least one laser diode. The second semiconductor die is bonded on the first semiconductor die using a chip-on-chip connecting technology to provide electrical connection between the electronic switch and the laser diode.

15 Claims, 7 Drawing Sheets

Related U.S. Application Data

(60) Provisional application No. 62/475,633, filed on Mar. 23, 2017.

(51) Int. Cl.
    *G01S 7/484*     (2006.01)
    *H01S 5/323*     (2006.01)
    *H01S 5/0234*     (2021.01)
    *H01S 5/02345*     (2021.01)

(56) References Cited

U.S. PATENT DOCUMENTS

| | | |
|---|---|---|
| 8,723,217 B2 | 5/2014 | Moon |
| 9,006,886 B2 | 4/2015 | Bak et al. |
| 9,379,517 B2 | 6/2016 | Wojcik et al. |
| 9,570,883 B2 | 2/2017 | Zarbock et al. |
| 9,698,086 B2 | 7/2017 | Soller |
| 2004/0032888 A1 | 2/2004 | Ferstl |
| 2004/0232430 A1 | 11/2004 | Lempkowski et al. |
| 2004/0247005 A1* | 12/2004 | Schrodinger ......... H01S 5/0261 372/38.1 |
| 2008/0043477 A1 | 2/2008 | Yamamoto et al. |
| 2011/0188530 A1 | 8/2011 | Lell et al. |
| 2014/0269804 A1* | 9/2014 | Lai ...................... H01S 5/02248 372/50.21 |
| 2017/0085057 A1 | 3/2017 | Barnes et al. |
| 2018/0045882 A1 | 2/2018 | Chojnacki et al. |
| 2018/0278011 A1 | 9/2018 | Galvano et al. |

FOREIGN PATENT DOCUMENTS

| | | |
|---|---|---|
| CN | 103531561 A | 1/2014 |
| CN | 103579211 A | 2/2014 |
| CN | 103891065 A | 6/2014 |
| DE | 202006005148 U1 | 9/2007 |
| DE | 102017118349 A1 | 2/2018 |
| WO | 2007112823 A3 | 10/2007 |

OTHER PUBLICATIONS

Prosecution History from U.S. Appl. No. 15/926,499, dated May 5, 2019 through Nov. 27, 2019, 41 pp.

Office Action, in the German language, from counterpart German Application No. 102018106860.3, dated Jul. 5, 2021, 7 pp.

* cited by examiner

LASER DIODE MODULE

This Application is a divisional of U.S. application Ser. No. 15/926,499, filed Mar. 20, 2018, which claims the benefit of U.S. Provisional Application 62/475,633, filed Mar. 23, 2017, the entire content of each of which are incorporated herein by reference.

TECHNICAL FIELD

This disclosure in general relates to aspects Laser diode packaging, in particular for system-in-a-chip (SoC) or system-in-a-package (SiP) LIDAR solutions.

BACKGROUND

Light Detection and Ranging (LIDAR) relates to a surveying method for measuring distance to an object (referred to as target) by illuminating the target with pulsed laser light, wherein the distance information may be obtained from the time-of-flight (TOF) of the light pulse travelling from the light source to the target and back to the detector. This time-of-flight is sometimes also referred to as round trip delay time (RTDT); the measured distance is basically the product between the RTDT and the speed of light. LIDAR is used, for example, in so-called time-of-flight cameras (TOF cameras), which allows mapping depth information to individual pixels and capturing the entire scene within the field of view of the TOF camera simultaneously. In contrast thereto, a scanning LIDAR scans the scene pointwise by deflecting the laser with, e.g., a mirror such as a microscanner (also referred to as micro-scanning mirror).

The irradiance (power per unit area) of the reflected light pulse arriving at the detector decreases with increasing distance of the target. To achieve a measurement range of up to several 10 or 100 meters, the radiant power of the emitted laser light (and thus the electrical power of the laser diode) is comparably high. However, to ensure that the laser pulses are harmless for the eyes of persons standing nearby, the laser pulses have to be comparably short to limit the radiant energy of a laser pulse. For a rectangular shaped pulse (power over time), the pulse energy would be proportional to the product of pulse width and power. In a realistic example, the peak power of a laser pulse may be up to 80 W or more with a pulse width in the range of 1 ns to 100 ns. To generate such short pulses the driver electronics used to drive the laser diode should be capable of switching the load current of the laser diode with extremely short rise and fall times.

SUMMARY

A laser diode module is described herein. In accordance with a first exemplary embodiment, the laser diode module includes a first semiconductor die including at least one electronic switch, and a second semiconductor die including at least one laser diode. The second semiconductor die is bonded on the first semiconductor die using a chip-on-chip connecting technology to provide electrical connection between the electronic switch and the laser diode.

In accordance with a second exemplary embodiment, the laser diode module includes a lead frame, a first semiconductor die including at least one electronic switch and attached to the lead-frame, at least one capacitor attached to the lead frame; and a second semiconductor die including at least one laser diode. The second semiconductor die is arranged between the lead frame and a metal cap or a metal clip, so that a bottom side of the second semiconductor die contacts the lead frame and a top side of the second semiconductor die contacts the clip or the metal cap.

In accordance with a third exemplary embodiment, the laser diode module includes a first semiconductor die with at least one electronic switch, a second semiconductor die including at least one laser diode, and a third semiconductor die including at least one buffer capacitor. The first and the third semiconductor die are embedded in one chip package and the second semiconductor die is a bare die bonded to a surface of the chip package.

In accordance with a third exemplary embodiment the laser diode module includes a first semiconductor die including at least one electronic switch, and a second semiconductor die including at least one laser diode. The first semiconductor die and the second semiconductor die are bare dies embedded in a circuit board.

In accordance with a third exemplary embodiment the laser diode module includes a first semiconductor die including at least one electronic switch and a second semiconductor die including at least one laser diode. The first semiconductor die is a bare die embedded in an intermediate level of a circuit board, whereas the second semiconductor die is arranged in a top or a bottom level of the circuit board.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1A:
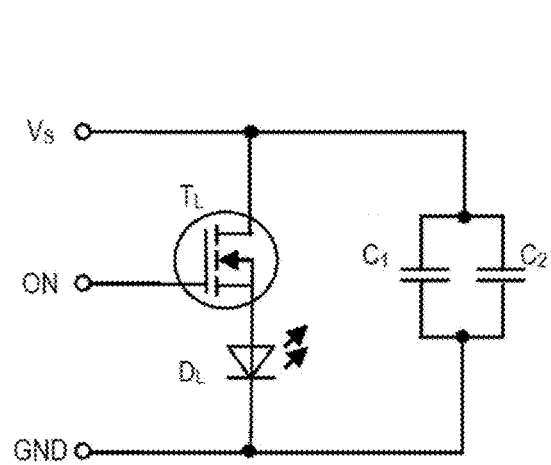
FIGS. 1A and 1B illustrate a circuit diagram (FIG. 1A) of a laser diode and an electronic switch for switching the laser diode and a schematic drawing (FIG. 1B) of a corresponding chip package.
Figure 1B:
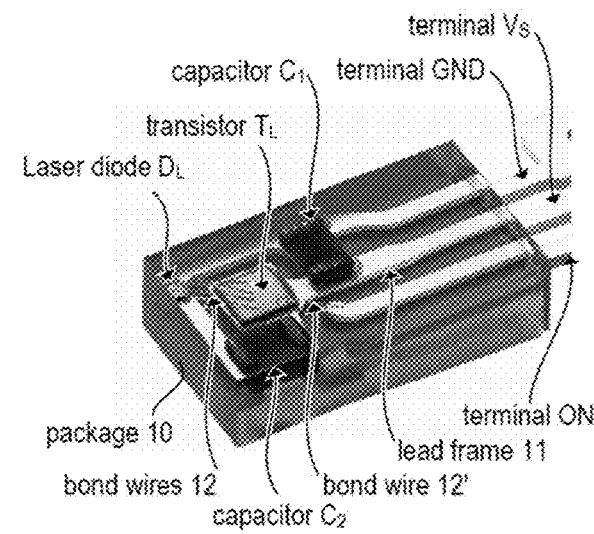

FIGS. 1A and 1B illustrate a laser diode and a portion of a driver circuit used to drive the laser diode. FIG. 1A is a circuit diagram of a laser diode $D_L$ and an electronic switch $T_L$ for switching the laser diode $D_L$ on and off. Accordingly, a series circuit of laser diode $D_L$ and electronic switch $T_L$ is coupled between ground terminal GND and supply terminal, at which a supply voltage $V_S$ is applied. At least one capacitor (in the present example a parallel circuit of capacitors $C_1$ and $C_2$) is connected in parallel to the series circuit of laser diode $D_L$ and electronic switch $T_L$ in order to buffer the supply voltage $V_S$ and provide load current to the laser diode $D_L$. The electronic switch $T_L$ may be a MOSFET or any other suitable transistor type (e.g. BJT). The control (gate or base) terminal of the electronic switch $T_L$ is labelled ON in the present example. Generally the buffer capacitance provided by capacitors $C_1$ and $C_2$ is needed to allow fast transients of the load current.

FIG. 1B is a schematic drawing of a laser diode module 1 with a chip package including the circuit of FIG. 1A. Accordingly, the chip package includes a first semiconductor die including the electronic switch $T_L$, a second semiconductor die including the laser diode $D_L$, and at least a third semiconductor die providing the buffer capacitance. Corresponding to FIG. 1A, two separate capacitors are used in the present example. A lead frame 11 provides three pins corresponding to the supply terminal (voltage $V_S$), the ground terminal GND and the control terminal ON, wherein the middle terminal is the supply terminal. The semiconductor dies including the buffer capacitors $C_1$ and $C_2$ are directly (i.e. without using bond wires) bonded (e.g. soldered) to the lead frame 11 and provide a buffer capacitance between the pins representing ground and supply terminal. The bottom metallization of the semiconductor die including the MOSFET $T_L$ represents the drain electrode of the MOSFET and is directly bonded (e.g. soldered) to the pin representing the supply terminal. The gate electrode in the top metallization layer of MOSFET $T_L$ is connected to the pin representing the control terminal ON via a bond wire 12'. Similarly, the source electrode in the top metallization layer of MOSFET $T_L$ is connected to the anode electrode on the top surface of laser diode $D_L$ via bond wires 12. The cathode electrode at the bottom surface of the laser diode $D_L$ is directly bonded (e.g. soldered) to the lead frame 11.

Figure 2:
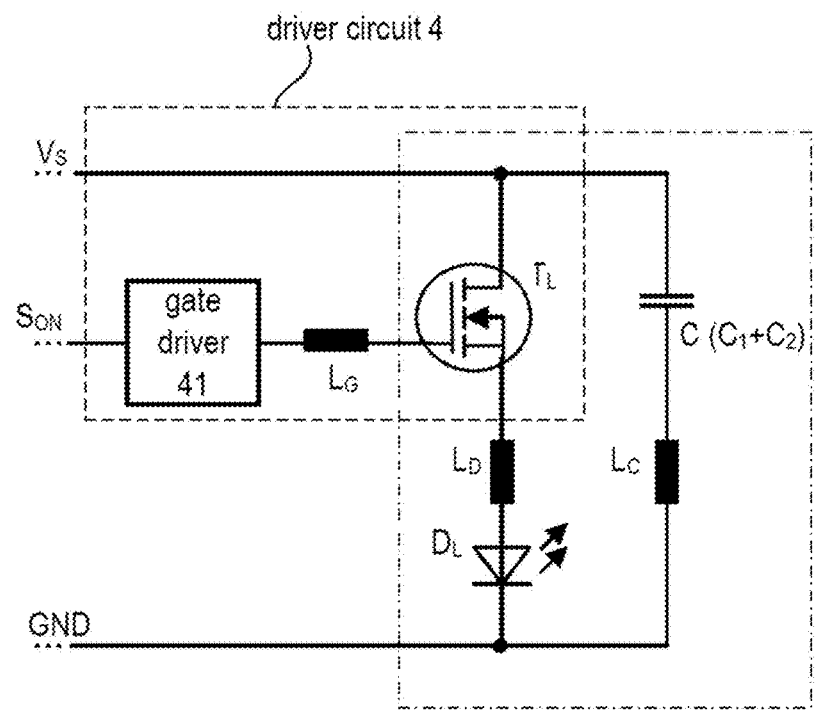
FIG. 2 illustrates an electric equivalent circuit of the laser diode package including parasitic inductances.

FIG. 2 illustrates a simplified electrical equivalent circuit of the laser diode module 1 of FIG. 1. Additionally, the circuit of FIG. 2 includes a gate driver circuit 41 coupled to the control electrode of the MOSFET $T_L$ and configured to generate drive signals suitable to switch the MOSFET $T_L$ on and off in accordance with a logic signal SON. Apart from the gate driver 41, the circuit of FIG. 2 is substantially the same as in FIG. 1A except the inductors $L_D$, $L_C$ and $L_G$ that represent parasitic inductances of the bond wires 12 (corresponds to inductance $L_D$), the electric connections between the capacitors $C_1$ and $C_2$ and the laser diode $D_L$ (corresponds to inductance $L_C$), and the electric connection (bond wire 12') between the control terminal ON and the actual control electrode of the MOSFET $T_L$ (corresponds to inductance $L_G$).

In LIDAR systems the measurement range depends on the radiant power of the laser pulse. However, to limit the pulse energy (to protect the eyes of persons in the environment of the LIDAR system) the laser pulses need to be rather short. The voltage drop $V_{LEFF}$ across the effective parasitic inductance $L_{EFF}$ ($L_{EFF}=L_C+L_D$) is given by $$V_{LEFF}=L_{EFF}\cdot \Delta i_L/t_{rise} \text{ and } V_{LEFF}=L_{EFF}\cdot \Delta i_L/t_{fall}$$

wherein $\Delta i_L$ is change of the load current (e.g. from 0 A to 40 A or from 40 A to 0 A), $t_{rise}$ is the respective rise time and $t_{fall}$ respective fall time. Assuming an effective inductance of 5 nH and a rise time of 2 ns yields a voltage drop of 100V. Accordingly, the system including the capacitors would have to be designed for a voltage of more than 110V (assuming 10V voltage drop across the laser diode and the MOSFET) in order to achieve the desired peak current within the desired rise time. It is noted, that a rise time of 2 ns may be too long for some applications. With the integration approach as illustrated in FIG. 1B, the inductance $L_{EFF}$ may be significantly reduced (probably below, e.g., 2 nH or even below 1 nH). The remaining inductance is predominantly caused by the bond wires 12 used to connect the MOSFET $T_L$ and the laser diode $D_L$. For example, the voltage drop $V_{LEFF}$ is still 80V when reducing the inductance $L_{EFF}$ to 1 nH when the load current is to be ramped up to 40 A within a rise time of 0.5 ns.

Figure 3:
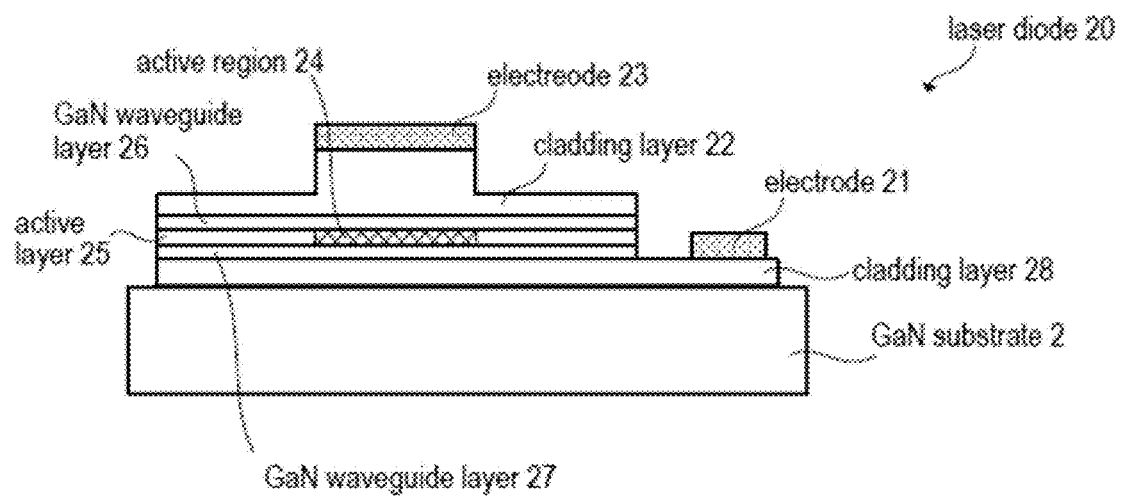
FIG. 3 illustrates a cross sectional view of one exemplary implementation of a laser diode.

Before describing various examples of laser modules using a system-on-chip (SoC) or a system-in-package (SiP) approach, which may help to further reduce effective inductance $L_{EFF}$, the structure of a laser diode and an integrated capacitor is described below with reference to FIGS. 3 and 4. FIG. 3 illustrates one exemplary implementation of a laser diode. Accordingly, the laser diode 20 includes a substrate 2, on which a plurality of functional layers (layers 25, 26 and 27) are formed using epitaxial growth. In the depicted example, the substrate 2 includes a GaN semiconductor material, on which a silicon-doped AlGaN cladding layer 28 and a silicon-doped GAN waveguide layer 27 are arranged. Thereabove, an active layer 25 having a multiple quantum well structure (MQW structure) having 1 to 5 GaInN quantum films and GaN barrier layers is provided. A magnesium-doped GaN waveguide layer 26 and a magnesium-doped AlGaN cladding layer 22 are applied on the active layer. Furthermore, one or a plurality of contact layers composed, for example, of magnesium-doped GaN can additionally be applied on the cladding layer 22, while one or a plurality of intermediate layers (not shown) can likewise be arranged between the substrate 2 and the cladding layer. The depicted sequence of layers forming the laser diode 20 is suitable for generating electromagnetic radiation in an ultraviolet to green, e.g. in a blue wavelength range.

As an alternative to the nitride-based semiconductor materials described herein, the laser diode may, for example, also comprise phosphide- and arsenide-based semiconductor materials such as a GaAs substrate 2 and thereabove a 100 nm thick intermediate layer 28 composed of AlGaAs having an Al proportion of approximately 40% of the group III materials and/or composed of InGaP having an In proportion of approximately 50% of the group III materials, thereabove a 2 μm thick InAlP wavelength layer 27, thereabove a 100 nm thick InGaAlP/InGaP quantum film/barrier layer MQW structure 25 having an In proportion of approximately 50% and an Al proportion of approximately 25%, thereabove a 2 μm thick InAlP waveguide layer 26, and, thereabove, a 100 nm thick InGaP intermediate layer 22 and furthermore a 300 nm thick GaAs contact layer (not shown). A sequence of semiconductor layers of this type may be suitable for generating green to infrared electromagnetic radiation, and particularly electromagnetic radiation in a red wavelength range. The functional layers may be formed on the substrate 2 using epitaxial growth. As an alternative thereto, the semiconductor layer sequence may be formed using thin-film technology. That means that the functional layers are grown on a substrate and subsequently transferred to a carrier substrate, which then forms the substrate 2 of the depicted sequence of semiconductor layers. Depending on the growth technique the n-conducting layers (or the p-conducting layers) may face the substrate 2.

The laser diode may be electrically contacted via electrode 21 arranged on the surface of the substrate 1 spaced apart from the functional layers 25, 26, and 27 and via electrode 23 arranged on the stack of functional layers 25, 26, and 27 as shown in FIG. 3. Thereby, the electrodes 21 and 23 may each have one or more layers comprising Ag, Au, Sn, Ti, Pt, Pd, Cr, Ni and/or Ge. Although a specific example of a laser diode has been described above, it is understood that various types of laser diodes are as such known and the exemplary embodiments described herein are not limited to any specific type of laser diode. It is noted that, in the example of FIG. 3 anode and cathode (electrodes 21 and 23) of the laser diode are at the same side of the semiconductor substrate 2. However, a very similar structure may be formed that has its electrodes on opposing sides of the semiconductor substrate. Both types of laser diodes may be used in accordance with various exemplary embodiments described herein. One example of a laser diode is described, e.g., in the publication US 2011/0188530 A1.

Figure 4:
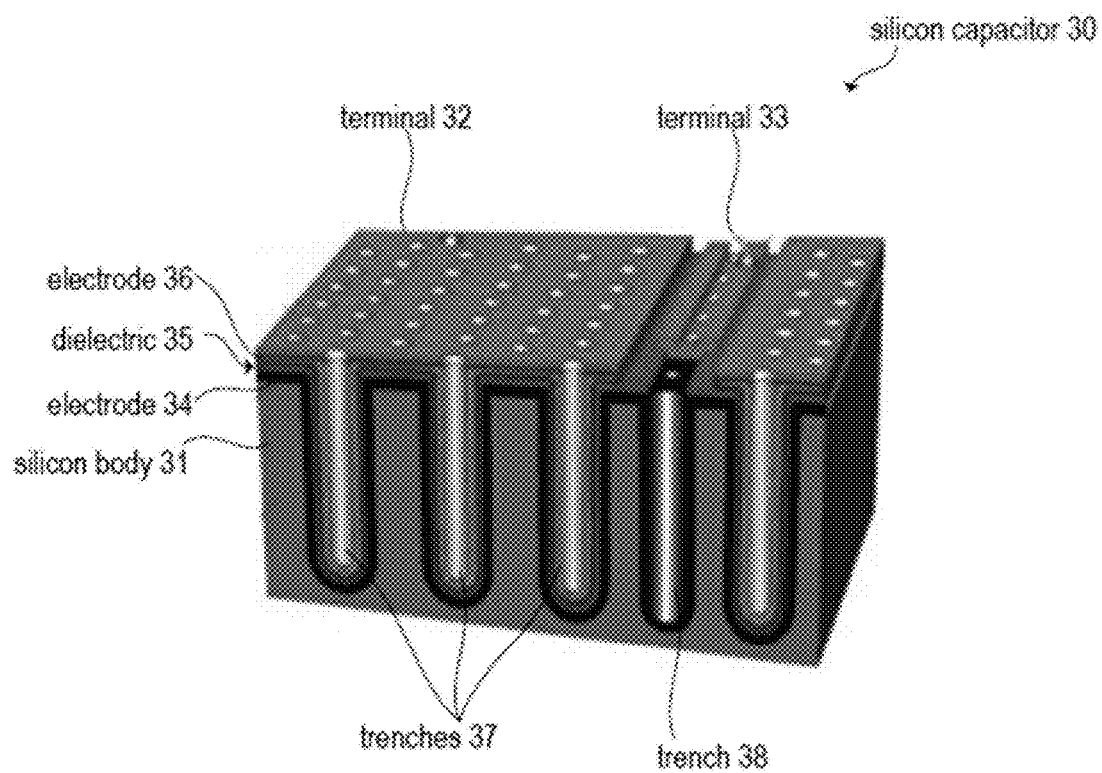
FIG. 4 illustrates a cross sectional view of an integrated silicon capacitor.

FIG. 4 illustrates a cross-sectional view of one example of a capacitor 30 integrated in a semiconductor body 31. A plurality of trenches 37, 38 are formed in the semiconductor body 31. A first electrode 34 extends on the surface of the silicon body throughout the trenches 37, 38. The purpose of the trenches is basically to increase the area of the electrodes and thus the achievable capacitance. The first electrode 34 is covered by an insulating dielectric layer 35, and a second electrode 36 is arranged on the dielectric 35 and extends throughout the trenches 37, whereas trench 38 is filled with electrode material and is electrically connected with the first electrode 34. In the present example polycrystalline silicon is used as electrode material. It is understood, however, that other materials may be used instead. On the top surface of the semiconductor body, the electrodes 34 and 36 may be contacted by metal electrodes/terminals 32 and 33, respectively. It is noted that, in the example of FIG. 4 both electrodes/terminals of the capacitor 30 are at the same side of the semiconductor body 31. However, a very similar structure may be formed that has its electrodes on opposing sides of the semiconductor body 31. Both types of capacitors may be used in accordance with various exemplary embodiments described herein. It is noted that trench capacitors as illustrated in FIG. 4 are as such know and commercially available and are thus not further discussed herein.

Figure 5:
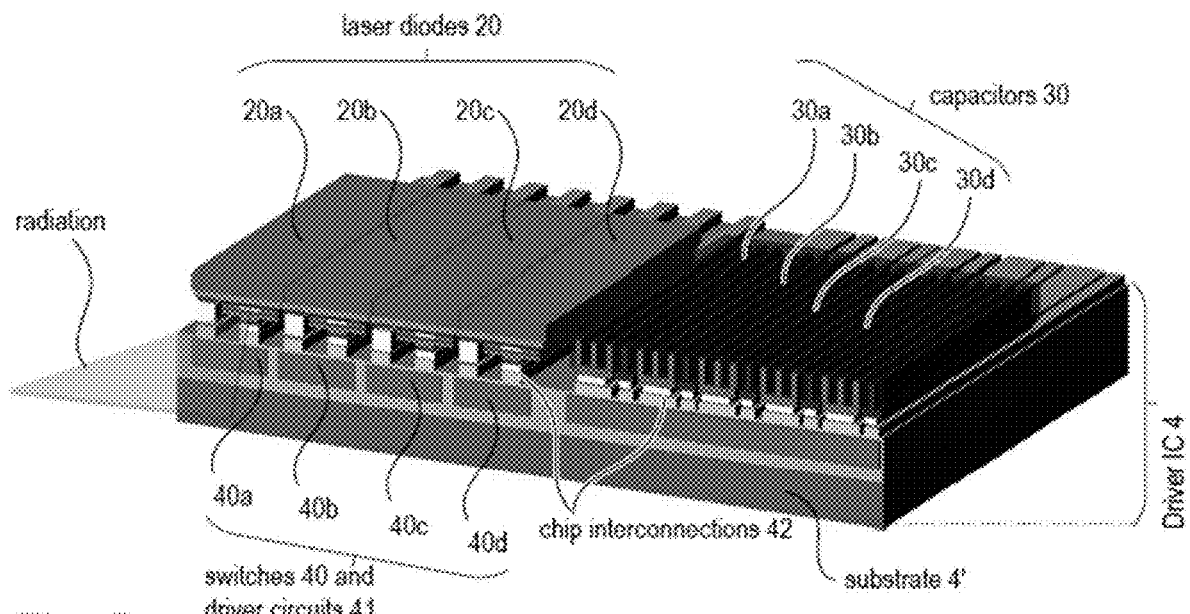
FIG. 5 illustrates one example of a system-on-chip (SoC) including laser diode, electronic switch, capacitances and driver circuit.

FIG. 5 illustrates one example of a system-on-chip (SoC) approach to form a laser diode module 1 including laser diode (cf. FIG. 2, laser diode $D_L$), an electronic switch 40 with (gate) driver circuit 41 (cf. FIG. 2, driver circuit 41) and capacitances 30 (cf. FIG. 2, buffer capacitors $C_1$, $C_2$). In the present example, four electronic switches 40a, 40b, 40c, and 40d (collectively 40) and respective driver circuits 41 are integrated in one semiconductor die referred to as driver IC 4 in FIG. 5 (cf. FIG. 2). The driver IC 4 includes a semiconductor substrate 4' (e.g. a silicon substrate) and chip interconnections 42 in the metallization layer arranged on the top surface of the semiconductor substrate 4'. The chip interconnections 42 allow for directly bonding (i.e. without using bond wires) the laser diodes 20 and capacitors 30 onto the driver IC 4 using a chip-on-chip bonding technique. As can be seen in FIG. 5, four laser diodes 20a, 20b, 20c, 20d (collectively 20) are flip-chip mounted on the driver IC 4. Similarly, the capacitors 30a, 30b, 30c, and 30d (collectively 30) are also flip-chip mounted on the driver IC 4.

In the present example, the laser diodes 20 have both electrodes (anodes and cathodes) on the same side of the semiconductor die (cf. FIG. 3, substrate 2), in which the diodes are integrated. Similarly, the capacitors 30 have their electrodes on the same side of the semiconductor die(s), in which the capacitors are integrated (cf. FIG. 4, silicon body 31). Having both electrodes on the same side allows a flip chip mounting of the capacitors 30 and the laser diodes 20 on the driver IC 4, which entails very short electrical lines between the laser diode, the electronic switches and the capacitors. Short electrical lines result in correspondingly low inductances (e.g. an effective inductance $L_{EFF}$ below 0.5 nH or even below 0.3 nH). In the present example, the laser diodes 20 are arranged vertically above that portion of the driver IC 4, in which the electronic switches 40 are located that switch the load currents of the laser diodes 20. In the present example, four laser diodes are included in the laser diode module 1. It is understood that, in other examples, more or less laser diodes (even a single laser diode) may be included in one laser diode module. Although the capacitors 30 are chip-on-chip mounted onto the driver IC 4 in the present example, trench capacitors may be also integrated together with the electronic switches 40 and the (gate) driver circuits 41 in one semiconductor die.

Figure 6:
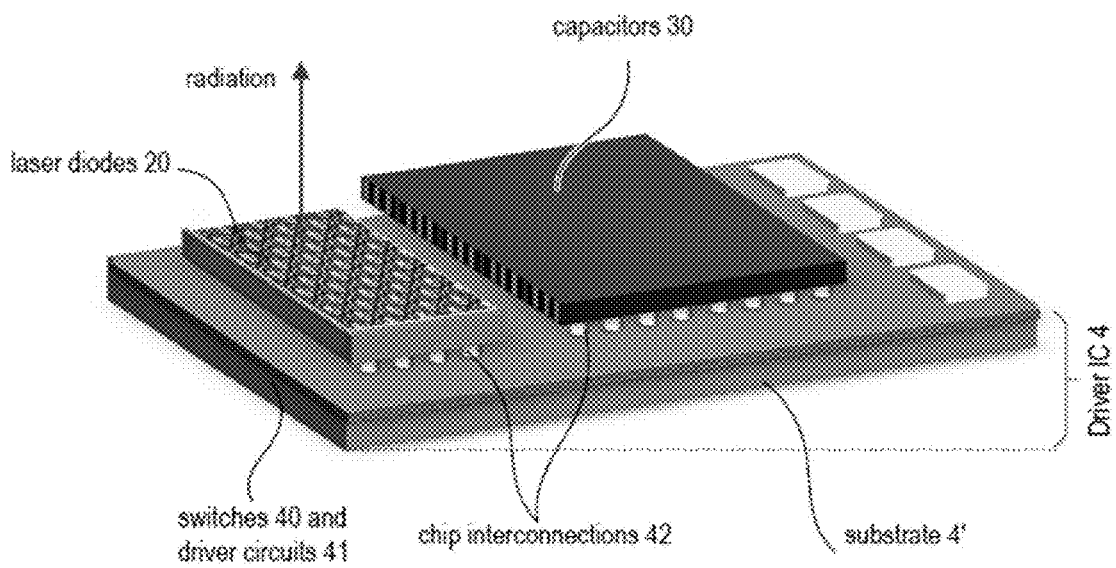
FIG. 6 illustrates an isometric view of another example of a system-on-chip (SoC) similar to FIG. 5.

In the example of FIG. 5 the radiation emitted by the laser diodes propagates along an axis parallel to the top surface of the driver IC 4. FIG. 6 illustrates an SoC laser diode module including one or more laser diodes which emit radiation along an axis perpendicular to the top surface of the driver IC 4. Apart from this, the example of FIG. 6 is substantially the same as the previous example of FIG. 5. However, due to the different direction of the radiation in the examples of FIGS. 5 and 6, different methods of covering the laser diodes 20 with a transparent mold compound (e.g. resin) may be applicable.

In the example of FIGS. 5 and 6, the laser diodes 20 have anode and cathode on the same side of the semiconductor die. The examples of FIGS. 7 and 8 illustrate exemplary systems-in-package (SiP) approaches for forming a laser diode module, in which the driver IC 4 is mounted on a lead frame 11 and one or more laser diodes 20 are attached (e.g. soldered) on the driver IC 4 using a chip-on-chip mounting technique, whereas the capacitors 30a, 30b are mounted (e.g. soldered) on the lead frame 11 adjacent to driver IC 4 without the need for bond wires.

Figure 7A:
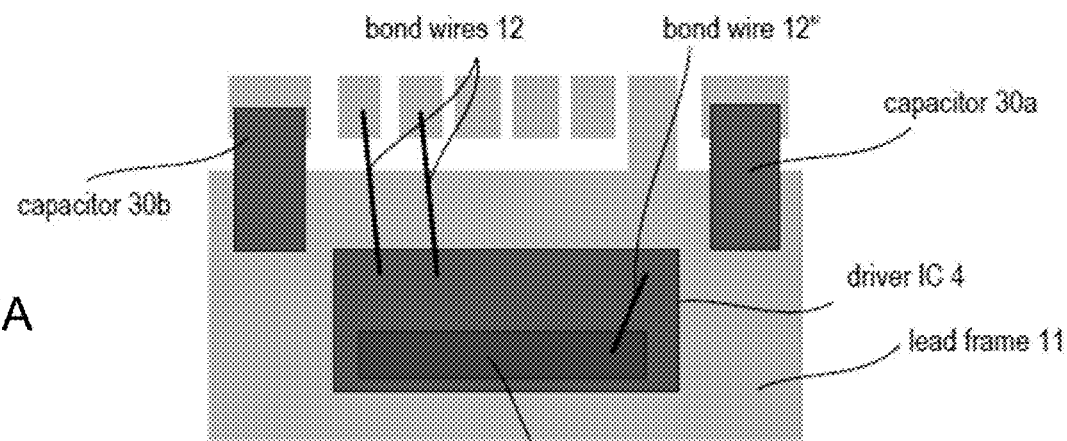
FIGS. 7A and 7B illustrates top view (FIG. 7A) and side view (FIG. 7B) of an exemplary system-in-package, in which a laser diode is chip-on-chip mounted on a driver IC arranged on a lead-frame together with silicon capacitors.
Figure 7B:
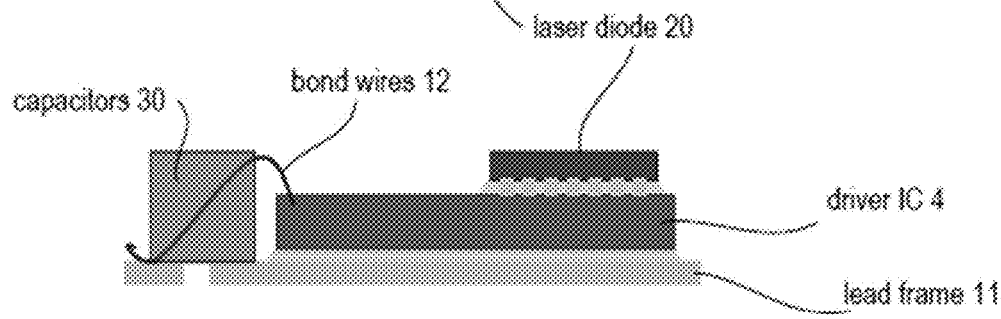
Figure 8:
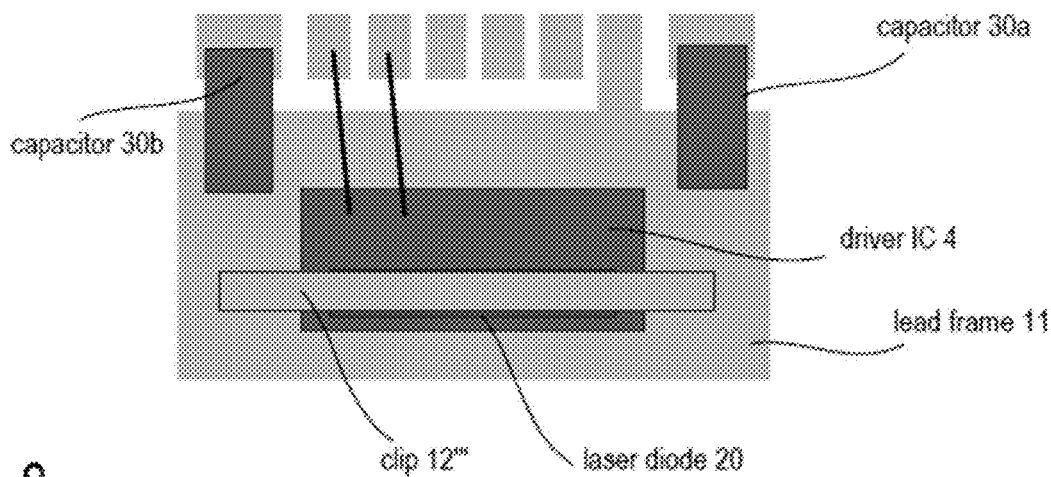
FIG. 8 illustrates an alternative example similar to FIGS. 7A and 7B.

FIG. 7A is a top view of a first example, in which the laser diode 20 has anode and cathode on opposing sides of the semiconductor die. One side of the laser diode die (anode or cathode) is attached (e.g. soldered) to the corresponding chip interconnection pad of the driver IC 4 (similar to chip interconnections 42 in the previous examples) using a chip-on-chip mounting technique, whereas the other side of the laser diode die is connected via a bond wire 12". Bond wires 12 are used as electrical connections between supply terminal and driver IC 4 as well as control terminal and driver IC 4. FIG. 7B illustrates a side view corresponding to the top view of FIG. 7A. FIG. 8 illustrates an exemplary alternative to the example of FIGS. 7A and 7B. Accordingly, the bond wire 12" is replaced by a clip 12''', which may result in a lower effective inductance $L_{EFF}$. Apart from the clip 12" the example of FIG. 8 is the same as the previous example of FIGS. 7A and 7B. The semiconductor dies including the driver IC 4, the laser diode(s) 20 and the capacitor(s) 30 may be encapsulated with a (at least partly) transparent resin (mold compound), which allows emission of the laser light while protecting the laser diode.

Figure 9A:
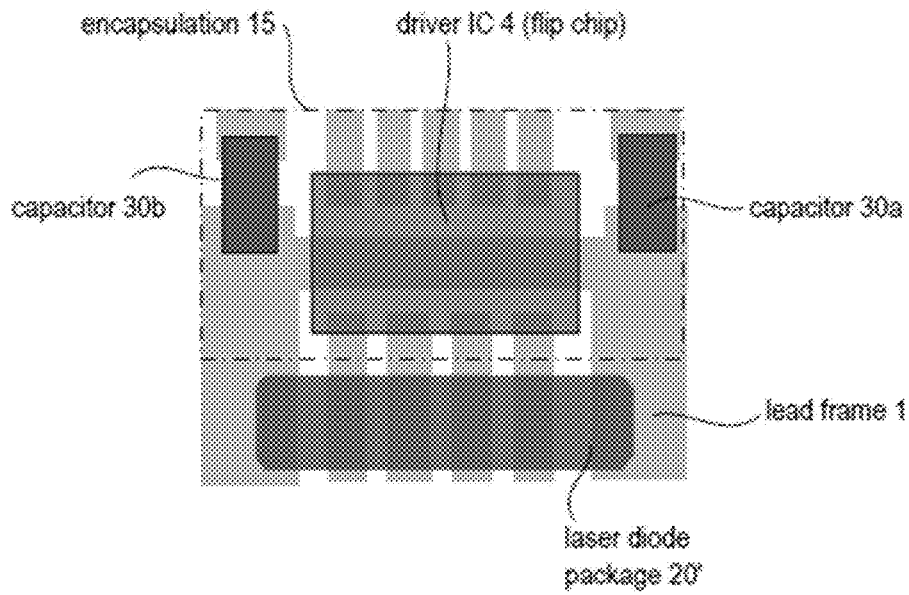
FIGS. 9A, 9B and 9C illustrate an alternative example similar to FIGS. 7A and 7B, in which the laser diode is arranged in a separate housing and soldered onto the lead frame and/or covered with a transparent mold compound.
Figure 9B:
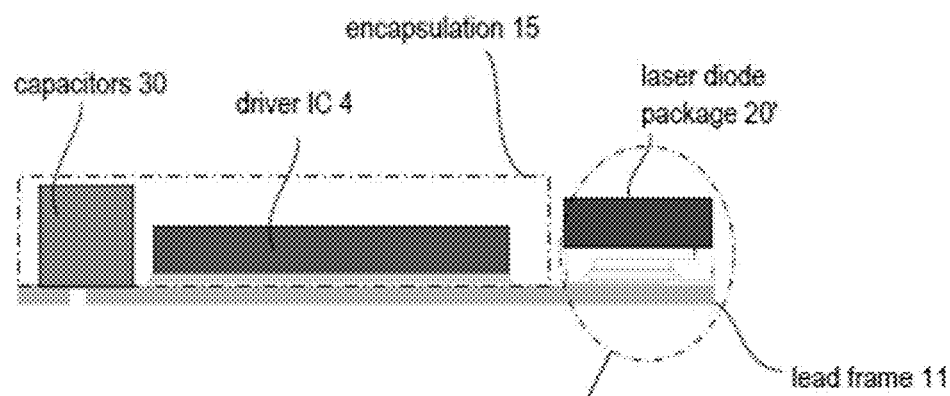
Figure 9C:
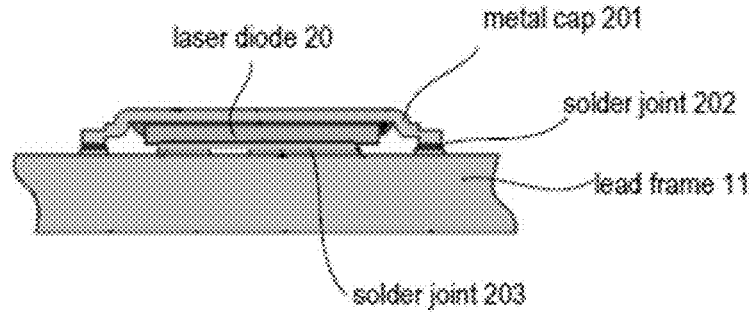

The example of FIGS. 9A, 9B and 9C illustrate another SiP laser diode module similar to the previous example of FIGS. 7A and 7B. FIG. 9A is a top view and FIG. 9B a corresponding side view. Accordingly, the capacitors 30a, 30b are mounted (e.g. soldered) on lead frame 11 without the need for any bond wires. Similarly, the driver IC 4 is also mounted to the lead frame 11, wherein also no bond wires are needed in the present example; flip-chip mounting technique or ball-grid-array (BGA) technique may be used. Driver IC and capacitors 30 are encapsulated using a resin or any suitable mold compound material, which does not need to be transparent. Outside this encapsulation 15 the packaged laser diode is mounted on the lead frame 11. To provide a low-inductance connection between the driver IC 4 and the laser diode package 20', the laser diode die 20 is attached in a metal cap 201 with its top side and to the lead frame 11 with its bottom side. FIG. 9C illustrates the laser diode package 20' in more detail. The package used for the laser diode 20 is substantially the same as the so-called DirectFET® package known for MOSFET devices. A small opening has to be provided in the package to allow emission of laser light. As an alternative to the DirectFET package, a simple clip connecting the top electrode of the laser diode 20 to the lead frame 11 may be used (similar to clip 12''' shown in FIG. 8). Finally, the laser diode may be covered with transparent material (e.g. resin, mold compound).

Figure 10:
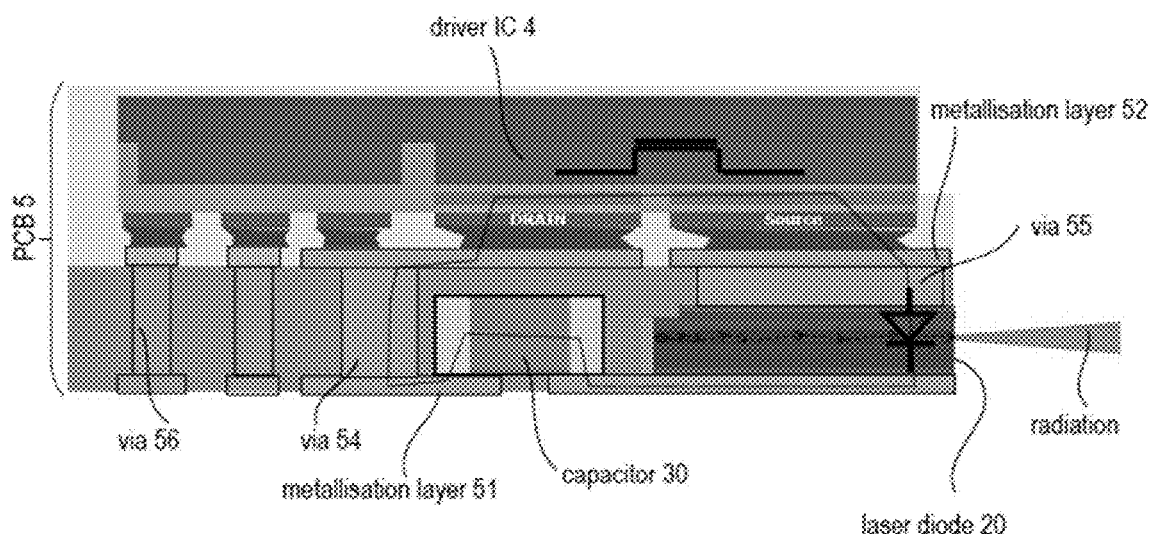
FIG. 10 illustrates a cross sectional view of one example of a system-in-package (SiP), in which laser diode, capacitors, electronic switch and driver circuit are embedded in a multilayer circuit board.
Figure 11:
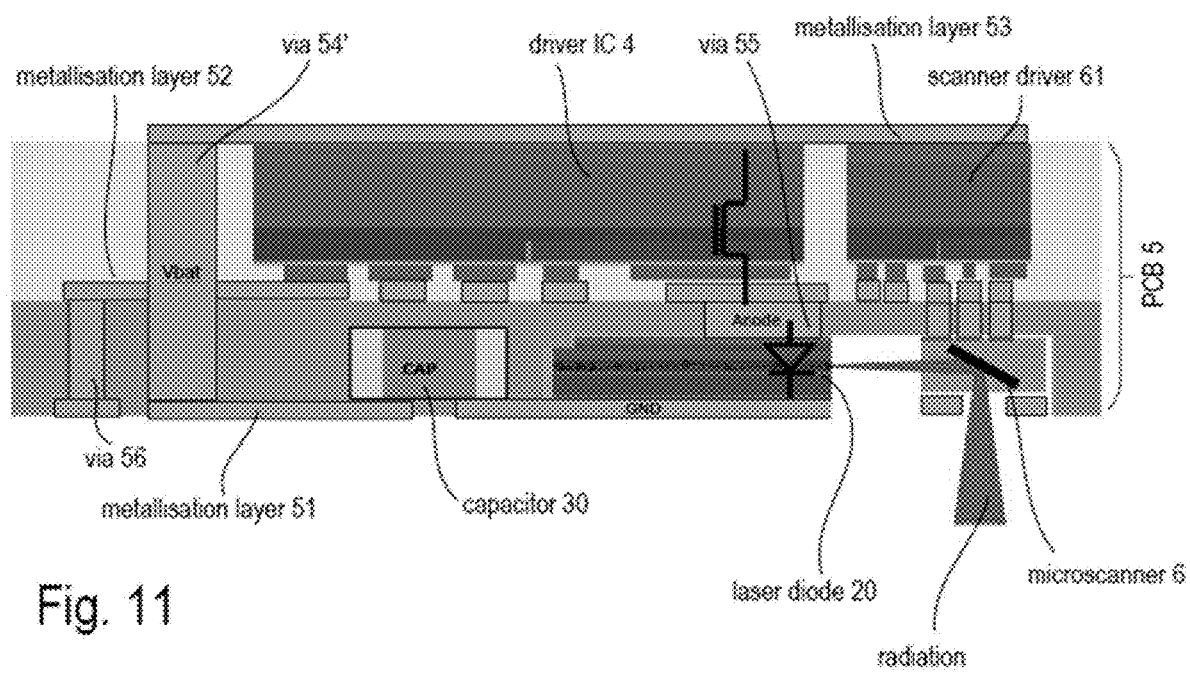
FIG. 11 illustrates a cross sectional view of another example of a system-in-package (SiP) similar to FIG. 10 additionally including a micro-scanning mirror and the respective micro-mirror driver IC.
Figure 12:
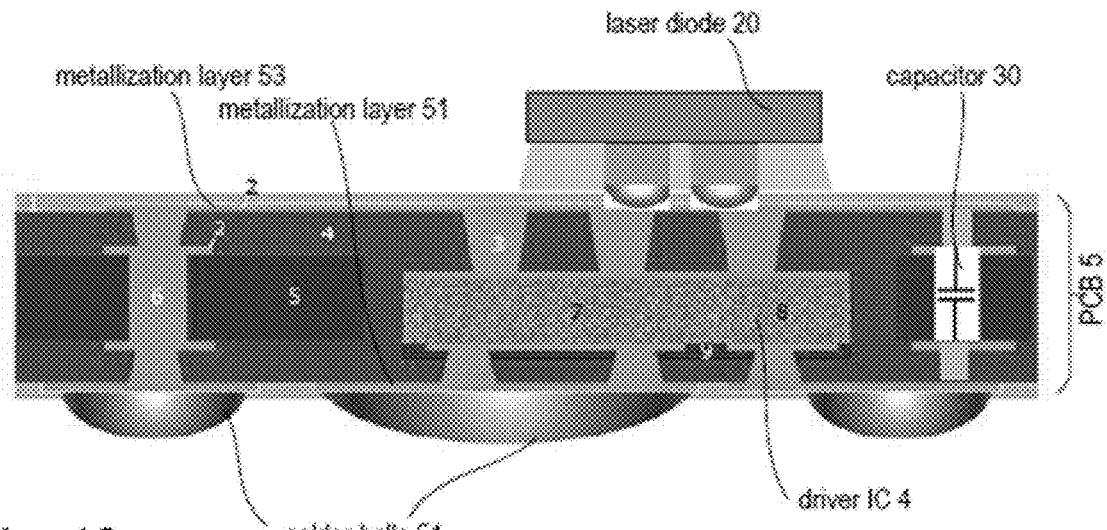
FIG. 12 illustrates a cross sectional view of another example of a system-in-package (SiP) similar to FIG. 10.

The examples of FIGS. 10, 11, and 12 illustrate further examples of SiP laser diode modules, in which the semiconductor dies including driver IC 4, the laser diode(s) 20, the capacitor(s) 30 and (optionally) further devices are embedded in a (e.g. multilayer) circuit board 5. According to the depicted example, the module includes at least three semiconductor dies, wherein a first semiconductor die includes at least one electronic switch 40 and respective driver circuitry (driver IC 4), a second semiconductor die includes at least one laser diode 20, and a third semiconductor die includes at least one buffer capacitor 30. It is understood that the capacitor is not necessarily a silicon capacitor (trench capacitor, see FIG. 4); in the present examples other types of capacitors such as ceramic capacitors may be used instead. In the example of FIG. 10, the semiconductor die forming the driver IC 4 has all contact pads (particularly the pads forming drain and source electrodes) on the same side so that the driver IC 4 may be attached to corresponding metal pads in the metallization layer 52 of the circuit board 5. The drain potential is guided through the circuit board 5 down to the layer 51 using via 54 as shown in FIG. 10.

In the example of FIG. 11, the semiconductor die forming the driver IC 4 has the drain contact of the MOSFET included in the semiconductor die on its top side and the other contacts (particularly the source contact) on its bottom side. Thus, drain and source of the MOSFET are connected to metal pads in the metallization layer 52 and the further metallization layer 53. The drain potential is guided through the circuit board 5 down to the layer 51 using via 54' as shown in FIG. 11. In both, the examples of FIGS. 10 and 11, the semiconductor die including capacitor(s) 30 (or, alternatively, e.g. a ceramic capacitor) is attached to metal pads in the metallization layer 51 subjacent to the layer 52. The laser diode is connected between a metal pad (attached to cathode of the laser diode 20) in layer 51 and another metal pad (attached to anode of the laser diode 20) in layer 52. A via 55 may bridge the vertical distance between the surface of the laser diode die 20 and layer 52. Via 56 guides the control terminal of the driver IC down to layer 51.

In the example of FIG. 11 a fourth semiconductor chip 6 including a micro-scanning mirror 6 (microscanner) is embedded in the circuit board 5 as well as a respective scanner driver IC 61. The micro-scanning mirror 6 is aligned with the laser diode to receive and redirect the laser light emitted from the laser diode 20. Generally, the material used for embedding the bare semiconductor dies may be any known material used to manufacture circuit boards. The process of embedding bare dies in a circuit board is as such known and thus not further discussed here. The embedding of the bare dies in the circuit board also allows for a reduction of the effective inductance in the load current path carrying the load current of the laser diode 20.

FIG. 12 illustrates a further example of a SiP laser diode module, wherein the driver IC 4 and the capacitor(s) 30 are embedded in a circuit board and the laser diode 20 is flip-chip mounded on the surface of the circuit board. Both, the driver IC 4 and the capacitor are embedded between two metallization layers of the circuit board 5. Solder balls 51 may be attached to the bottom surface of the circuit board 5 to allow soldering the circuit board onto another circuit board or a similar carrier board. Thus, the circuit board 5 of FIG. 12 may also be referred to as package-like PCB. One difference between the previous examples of FIGS. 10 and 11 and the present example of FIG. 12 is the different arrangement order of the three circuit elements driver IC 4, capacitor 30 and laser diode 20. As shown in FIG. 12, the laser diode is arranged in another level of the Circuit board 5 as the capacitor 30, whereas these elements are arranged in the same level in the previous examples.

Figure 13A:
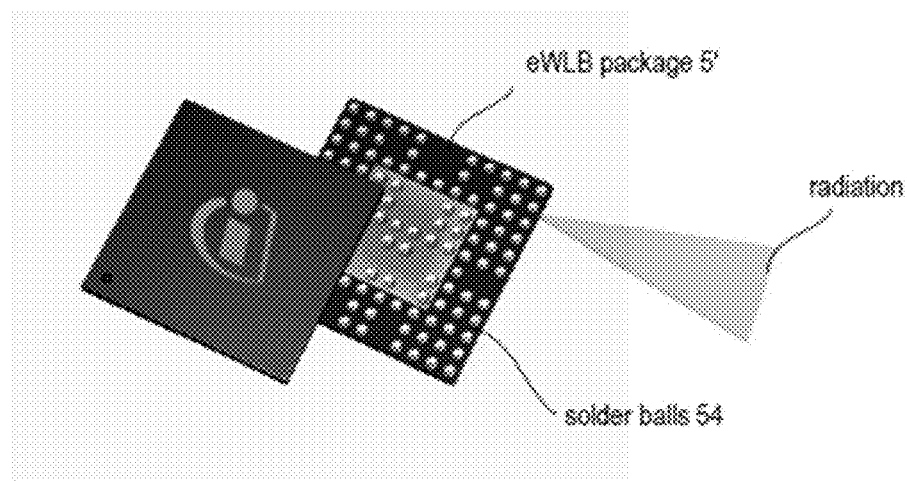
FIGS. 13A and 13B illustrate another example of a system-in-package (SiP), in which driver IC and capacitors are arranged in an eWLB package with the laser diode(s) directly soldered onto the eWLB package.
Figure 13B:
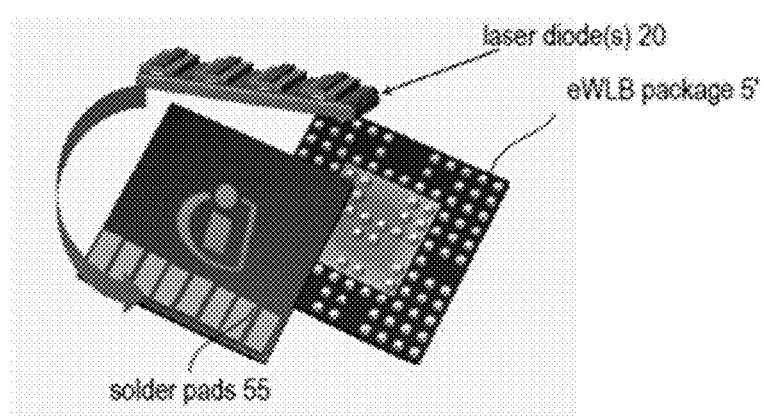

FIGS. 13A and 13B illustrate another example of a SiP laser diode module. In this example, the driver IC 4 and the capacitor(s) 30 are included in an enhanced wafer level ball-grid array (eWLB) package. The laser diode (bare die) may be either soldered onto solder balls 54 at the bottom side of the eWLB package or to dedicated solder pads 55 on the top side of the eWLB package.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention. For example, in any embodiment the capacitor may be integrated in the same semiconductor die as the laser diode driver IC 4 instead of attaching the capacitor onto the driver IC 4.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

EXAMPLES

Example 1—A laser diode module comprising: a first semiconductor die including at least one electronic switch; and a second semiconductor die including at least one laser diode, wherein the second semiconductor die is bonded on the first semiconductor die using a chip-on-chip connecting technology to provide electrical connection between the electronic switch, the laser diode.

Example 2—The laser diode module of example 1, further comprising: a third semiconductor die including at least one buffer capacitor; the third semiconductor die being bonded on the first semiconductor die using a chip-on-chip connecting technology.

Example 3—The laser diode module of examples 1 or 2, wherein the first semiconductor die further includes at least one driver circuit coupled to the electronic switch and configured to drive the electronic switch on and off.

Example 4—The laser diode module of any of examples 1 to 3, wherein the second semiconductor die has two electrodes on the same side and is flip-chip mounted on the first semiconductor die.

Example 5—The laser diode module of example 2, wherein the third semiconductor die has two electrodes on the same side and is flip-chip mounted on the first semiconductor die.

Example 6—The laser diode module of any of examples 1 to 5, wherein the second semiconductor die has a first electrode on a top side and a second electrode on a bottom side of the second semiconductor die, the second electrode being bonded to the first semiconductor die using chip-on-chip connecting technology and the first electrode being connected to the first semiconductor die using a clip or a bond wire.

Example 7—The laser diode module of any of examples 1 to 6, wherein the electronic switch and the laser diode are connected in series between a supply terminal and a ground terminal.

Example 8—The laser diode module of example 2, wherein the electronic switch and the laser diode are connected in series between a supply terminal and a ground terminal, and wherein the buffer capacitor is connected between a supply terminal and a ground terminal.

Example 9—The laser diode module of any of examples 1 to 8, wherein the first semiconductor die includes at least one buffer capacitor.

Example 10—The laser diode module of any of examples 1 to 9, further comprising a lead frame, on which the first semiconductor die is attached.

Example 11—The laser diode module of example 10, wherein the first semiconductor die is flip-chip mounted on the lead frame without using bond wires.

Example 12—The laser diode module of example 10 or 11, further comprising at least one capacitor attached on the lead-frame.

Example 13—A laser diode module comprising a lead frame; a first semiconductor die including at least one electronic switch and attached to the lead-frame; at least one capacitor attached to the lead frame; and a second semiconductor die including at least one laser diode; the second semiconductor die being arranged between the lead frame and a metal cap or a metal clip, so that a bottom side of the second semiconductor die contacts the lead frame and aa top side of the second semiconductor die contacts the clip or the metal cap.

Example 14—The laser diode module of example 13, wherein the first semiconductor die is flip-chip mounted on the lead frame without using bond wires.

Example 15—The laser diode module of examples 13 or 14, wherein the at least one capacitor is surface mounted on the lead frame without using bond wires.

Example 16—A laser diode module comprising a first semiconductor die including at least one electronic switch; a second semiconductor die including at least one laser diode; and a third semiconductor die including at least one buffer capacitor, wherein the first and the third semiconductor die are embedded in one chip package and the second semiconductor die is a bare die bonded to a surface of the chip package.

Example 17—The laser diode module of example 16, wherein the chip package is an enhanced wafer level ball grid array (eWLB) package.

Example 18—The laser diode module of example 16 or 17, wherein the second semiconductor is soldered solder pads arranged either on the top side or the bottom side of the chip package.

Example 19—The laser diode module of any of examples 16 to 18, wherein the electronic switch and the laser diode are connected in series between a supply terminal and a ground terminal, and wherein the buffer capacitor is connected between a supply terminal and a ground terminal.

Example 20—A laser diode module comprising: a first semiconductor die including at least one electronic switch; and a second semiconductor die including at least one laser diode, wherein the first semiconductor die and the second semiconductor die are bare dies embedded in a circuit board.

Example 21—The laser diode module of example 20 further comprising a third semiconductor die including at least one buffer capacitor, the third semiconductor die being embedded in the circuit board.

Example 22—The laser diode module of example 20 or 21, wherein a buffer capacitor is included in the first semiconductor die.

Example 23—The laser diode module of example 22, wherein the buffer capacitor is configured to buffer a supply voltage.

Example 24—The laser diode module of any of examples 20 to 23, further comprising a fourth semiconductor chip including a micro-scanning mirror.

Example 25—The laser diode module of any of examples 20 to 24, wherein the electronic switch and the laser diode are connected in series between a supply terminal and a ground terminal.

Example 26—The laser diode module of example 21 or 22, wherein the electronic switch and the laser diode are connected in series between a supply terminal and a ground terminal, and wherein the buffer capacitor is connected between a supply terminal and a ground terminal.

Example 27—The laser diode module of example 21, wherein the third semiconductor die is arranged on a first metallization layer of the circuit board.

Example 28—The laser diode module of any of examples 20 to 27, wherein the second semiconductor die is arranged between a first metallization layer and a second metallization layer of the circuit board.

Example 29—The laser diode module of example 28, wherein the first semiconductor die is arranged between the second metallization layer and a third metallization layer of the circuit board.

Example 30—A laser diode module comprising a first semiconductor die including at least one electronic switch; and a second semiconductor die including at least one laser diode, wherein the first semiconductor die is a bare die embedded in an intermediate level of a circuit board, and wherein the second semiconductor die is arranged in a top or a bottom level of the circuit board.

Example 31—The laser diode module of example 30, further comprising at least one buffer capacitor embedded in an intermediate level of a circuit board.

We claim:

1. A laser diode module comprising:
a first semiconductor die including at least one electronic switch;
a second semiconductor die including at least one laser diode; and
at least one buffer capacitor arranged as a trench capacitor,
wherein the first semiconductor die is a first bare die embedded in an intermediate level of a circuit board,
wherein the second semiconductor die is arranged on a top level of the circuit board,
wherein the at least one electronic switch and the at least one laser diode are connected in series directly between a first node at a supply terminal and a second node at a ground terminal,
wherein the at least one buffer capacitor is connected between the first node at the supply terminal and the second node at the ground terminal so that the at least one buffer capacitor is connected in parallel with the at least one electronic switch and the at least one laser diode,
wherein the at least one electronic switch and the at least one buffer capacitor are connected to the first node, and
wherein the at least one buffer capacitor and the at least one laser diode are connected to the second node.

2. The laser diode module of claim 1, wherein the at least one buffer capacitor is embedded in the circuit board.

3. The laser diode module of claim 2, wherein the at least one buffer capacitor is included in the first semiconductor die.

4. The laser diode module of claim 2, wherein the at least one buffer capacitor is included in a third semiconductor die, wherein the third semiconductor die comprises a second bare die that is embedded in the intermediate level of the circuit board.

5. The laser diode module of claim 4, wherein the third semiconductor die is arranged on a different level of the circuit board from the second semiconductor die.

6. The laser diode module of claim 4, wherein the third semiconductor die is arranged on a first metallization layer of the circuit board.

7. The laser diode module of claim 4,
wherein the first semiconductor die is arranged between a first metallization layer and a second metallization layer of the circuit board, and
wherein the third semiconductor die is arranged between the first metallization layer and the second metallization layer of the circuit board.

8. The laser diode module of claim 2, wherein the at least one buffer capacitor is configured to buffer a supply voltage.

9. The laser diode module of claim 1, wherein the first semiconductor die is arranged between a first metallization layer and a second metallization layer of the circuit board.

10. The laser diode module of claim 1, wherein the second semiconductor die comprises a flip-chip mounted on a surface of the circuit board.

11. The laser diode module of claim 1, further comprising solder balls attached to a bottom level of the circuit board to allow soldering the circuit board onto another circuit board or a carrier board,
wherein the second semiconductor die is arranged in the top level of the circuit board.

12. A laser diode module comprising:
a circuit board including:
a first metallization layer on a top level of the circuit board; and
a second metallization layer on a bottom level of the circuit board;
a first semiconductor die including at least one electronic switch;
a second semiconductor die including at least one laser diode; and
a third semiconductor die including at least one buffer capacitor arranged as a trench capacitor; and
at least one buffer capacitor,
wherein the first semiconductor die is a first bare die embedded in an intermediate level of the circuit board between the first and second metallization layers,
wherein the second semiconductor die is flip-chip mounted on the first or second metallization layer, and
wherein the third semiconductor die is a second bare die embedded in the intermediate level of the circuit board between the first and second metallization layers,
wherein the at least one electronic switch and the at least one laser diode are connected in series directly between a first node at a supply terminal and a second node at a ground terminal,
wherein the at least one buffer capacitor is connected between the first node at the supply terminal and the second node at the ground terminal so that the at least one buffer capacitor is connected in parallel with the at least one electronic switch and the at least one laser diode,
wherein the at least one electronic switch and the at least one buffer capacitor are connected to the first node, and
wherein the at least one buffer capacitor and the at least one laser diode are connected to the second node.

13. The laser diode module of claim 12,
wherein the at least one buffer capacitor is configured to buffer a supply voltage.

14. The laser diode module of claim 12, further comprising solder balls attached to the second metallization layer to allow soldering the circuit board onto another circuit board or a carrier board,
wherein the second semiconductor die is flip-chip mounted on the first metallization layer.

15. The laser diode module of claim 12,
wherein the first semiconductor die is separate from the second semiconductor die and the third semiconductor die, and
wherein the second semiconductor die is separate from the third semiconductor die.

* * * * *

UNITED STATES PATENT AND TRADEMARK OFFICE
CERTIFICATE OF CORRECTION

PATENT NO. : 11,316,322 B2
APPLICATION NO. : 16/802294
DATED : April 26, 2022
INVENTOR(S) : Maurizio Galvano et al.

It is certified that error appears in the above-identified patent and that said Letters Patent is hereby corrected as shown below:

In the Claims

Column 12, Claim 12, Line 22-23: "…trench capacitor; and at least one buffer capacitor, wherein…" should be "…trench capacitor; and wherein…"

Signed and Sealed this
Twenty-third Day of August, 2022

Katherine Kelly Vidal
*Director of the United States Patent and Trademark Office*